(12) United States Patent
Du et al.

(10) Patent No.: US 8,437,086 B2
(45) Date of Patent: May 7, 2013

(54) BEAM COMBINING LIGHT SOURCE

(75) Inventors: Jihua Du, Santa Clara, CA (US); James Yonghong Guo, Fremont, CA (US); Lei Xu, San Jose, CA (US); Richard L. Duesterberg, Mountain View, CA (US); Jay A. Skidmore, San Jose, CA (US)

(73) Assignee: JDS Uniphase Corporation, Milipitas, CA (US)

( * ) Notice: Subject to any disclaimer, the term of this patent is extended or adjusted under 35 U.S.C. 154(b) by 217 days.

(21) Appl. No.: 13/077,592

(22) Filed: Mar. 31, 2011

(65) Prior Publication Data

US 2012/0002395 A1 Jan. 5, 2012

Related U.S. Application Data

(63) Continuation-in-part of application No. 12/827,946, filed on Jun. 30, 2010.

(51) Int. Cl.
 *G02B 27/14* (2006.01)
(52) U.S. Cl.
 USPC .......................................... 359/629; 359/618
(58) Field of Classification Search .................... 359/629
 See application file for complete search history.

(56) References Cited

U.S. PATENT DOCUMENTS

| | | | |
|---|---|---|---|
| 4,828,357 A | 5/1989 | Arata et al. ..................... 359/853 |
| 4,978,197 A | 12/1990 | Horikawa ..................... 359/629 |
| 4,986,634 A | 1/1991 | Horikawa et al. ............. 359/618 |
| 5,048,911 A | 9/1991 | Sang et al. ....................... 385/33 |
| 5,138,491 A | 8/1992 | Horikawa et al. ............. 359/622 |
| 5,185,758 A | 2/1993 | Fan et al. ......................... 372/72 |
| 5,216,544 A | 6/1993 | Horikawa et al. ............. 359/622 |
| 5,268,978 A | 12/1993 | Po et al. ........................... 385/33 |
| 5,319,528 A | 6/1994 | Raven ............................. 362/533 |
| 5,933,278 A | 8/1999 | Plummer et al. .............. 359/627 |
| 6,005,717 A | 12/1999 | Neuberger et al. ............ 359/619 |
| 6,044,096 A | 3/2000 | Wolak et al. ..................... 372/36 |
| 6,124,973 A | 9/2000 | Du et al. .......................... 359/618 |
| 6,151,168 A | 11/2000 | Goering et al. ................ 359/623 |
| 6,494,371 B1 | 12/2002 | Rekow et al. .................. 235/454 |
| 6,898,222 B2 | 5/2005 | Hennig et al. ................... 372/36 |
| 7,006,549 B2 | 2/2006 | Anikitchev et al. ............. 372/97 |
| 7,376,296 B2 | 5/2008 | Goncharov et al. ............. 385/18 |
| 7,586,963 B2 | 9/2009 | Schulte et al. ................... 372/36 |
| 7,668,214 B2 | 2/2010 | Wilson et al. .................... 372/23 |
| 2002/0051360 A1 | 5/2002 | Solodovnikov et al. ...... 362/244 |
| 2007/0116077 A1 | 5/2007 | Farmer et al. ............. 372/50.12 |
| 2007/0195850 A1 | 8/2007 | Schluter et al. .......... 372/50.124 |
| 2008/0063017 A1 | 3/2008 | Schnitzler et al. .............. 372/35 |
| 2008/0198893 A1 * | 8/2008 | Bartoschewski et al. ....... 372/98 |
| 2008/0310027 A1 | 12/2008 | Wilson et al. .................. 359/641 |
| 2009/0245315 A1 | 10/2009 | Faybishenko .............. 372/50.12 |
| 2009/0323752 A1 | 12/2009 | Chuyanov et al. ......... 372/50.12 |

\* cited by examiner

*Primary Examiner* — James Jones
(74) *Attorney, Agent, or Firm* — Matthew A. Pequignot; Pequignot + Myers LLC

(57) ABSTRACT

The invention relates to sources of optical radiation wherein polarized radiation from first and second rows of light emitters is first collimated and combined into two combined beam using first and second rows of collimating and beam re-directing elements, respectively, and then polarization multi-plexed to form a polarization-multiplexed output beam. In order to reduce the footprint, emitters of the first and second emitter rows are disposed in an interleaved, staggered arrangement, and the second row of collimating and beam re-directing elements is disposed in a space between the first emitter row and the first row of collimating and beam re-directing elements.

18 Claims, 13 Drawing Sheets

BEAM COMBINING LIGHT SOURCE

CROSS-REFERENCE TO RELATED APPLICATIONS

The present invention is a continuation-in-part of a U.S. patent application Ser. No. 12/827,946 filed Jun. 30, 2010, which is incorporated herein by reference for all purposes.

TECHNICAL FIELD

The present invention generally relates to sources of optical radiation wherein light from multiple emitters is combined into a single output beam, and more specifically relates to combining polarized light from multiple laser or light emitting diodes into a single output beam for coupling into an optical fiber or waveguide.

BACKGROUND OF THE INVENTION

Semiconductor laser diodes, manufactured as single emitter lasers or laser diode bars, have a high electrical-to-optical conversion efficiency, and can presently achieve optical power levels of a few Watts or even tens of Watts per single emitter laser diode, and tens to hundreds of Watts per laser diode bar. Due to high efficiency, reasonable power levels, and high spectral and directional brightness, laser diodes and laser diode bars find applications in many areas, such as material processing, offset printing, medical treatment, pumping of solid state lasers, and pumping of fiber lasers.

However, light emitted from a high power single emitter diode laser is typically highly asymmetric due to a thin-slab geometry of the laser diodes resulting in long and thin emitting apertures. The light beam emitted by such lasers has much higher brightness in its "fast axis", which is perpendicular to the main p/n junctions and to the active layer of the laser, than in its "slow axis", which is parallel to the active layer. Many applications require that the light be coupled into an optical fiber, which generally has a substantially circular or polygonal cross-section and has a substantially symmetrical acceptance angle. To obtain the highest brightness out of the fiber, light beams from multiple single emitter diode lasers are coupled into a single fiber stacked in their fast axis direction, as described for example in U.S. Pat. Nos. 6,898,222, 7,668,214, which are incorporated herein by reference, and US Patent Applications 2009/0245315 and 2009/0323752, which are also incorporated herein by reference. For example, an array of 3-10 individual laser emitters with a 100 micrometers (um) aperture width in the slow axis can be coupled into a fiber with a 105 um diameter and 0.15 NA (numerical aperture) by stacking individual laser beams in the fast axis direction.

Since the diode laser emission is typically polarized, polarization beam combining may be used to couple light emitted by two arrays of single emitters into a single fiber, thereby doubling the power and brightness of the output beam. One example of such laser beam combining device, which incorporates both the spatial stacking of equally polarized laser beams with polarization multiplexing of stacked beams from two laser arrays, is disclosed by Horikawa in U.S. Pat. No. 4,978,197, which is incorporated herein by reference. The beam combining device of Horikawa is a substantially three-dimensional device and is illustrated in FIG. 1. In this device, two rows of lasers 3 are positioned on an upper plate 2A of a multi-level support structure 2. A middle level plate 2B positioned beneath the upper plate 2A includes two rows of collimating lenses 4. The light beams emitted by the lasers 3 downwardly normally to the plates 2A and 2B, are collimated by the lenses 4, and then reflected by two rows of vertically offset prism mirrors 5 positioned on a lower plate 2C, to form two vertically stacked beams that are polarization combined using a polarization beam combiner (PBC) 7 and a half wave plate 9. One drawback of the device of Horikawa is that it is relatively bulky due to, at least in part, its essentially three-dimensional structure, which may also complicated assembly and alignment. Another drawback is that dissipating heat from the laser diodes may be more complicated.

In another example, U.S. Patent Application 2008/0198893 to Bartoschewski et al describes a laser assembly that is illustrated in FIG. 2. In this laser assembly, light from two groups of vertically offset semiconductor lasers 100-106 and 107-113, each of the lasers incorporating a fast-axis collimator, is re-directed by two groups of mirrors 200-206 and 2007-213 along two parallel paths, wherein two slow-axis collimators 301 and 302 are positioned. The slow-axis collimated light beams are then combined using a PBC 400 and a half wave plate 500.

In the laser assembly of FIG. 2, the semiconductor lasers 100-113 in each of the two groups are oriented differently, and so are the reflectors 200-213 associated therewith. This arrangement, although conserving space occupied by the assembly, can disadvantageously complicate the optical alignment of individual elements in the assembly, and its overall fabrication.

An object of the present invention is to overcome at least some of the disadvantages of the prior art by providing a beam combining light source that would be compact, relatively easy to assemble and align, and would utilize polarization beam combining of light from multiple single emitters.

SUMMARY OF THE INVENTION

Accordingly, the present invention relates to a beam combining light source, comprising: first and second rows of light emitters for emitting a plurality of first emitter beams and a plurality of second emitter beams, respectively; first and second rows of beam collimating reflectors for collimating the first and second emitter beams, respectively, and for re-directing thereof for forming first and second combined beams, wherein the first and second rows of beam collimating reflectors are spaced apart from the first and second rows of light emitters, respectively. The light emitters of the first and second rows are disposed in a staggered arrangement with a lateral offset therebetween. The second row of collimating reflectors is disposed at least partially in a space between the first row of light emitters and the first row of beam collimating reflectors, and the lateral offset between the first and second rows of the light emitters is such that the beam collimating reflectors of the second row do not block any of the first emitter beams.

A feature of the present invention provides a plurality of fast axis collimators disposed at an output of the light emitters for collimating each of the first and second emitter beams in a fast axis plane.

In accordance with a feature of the present invention, the light emitters are disposed in a plurality of levels, one light emitter of each of the first and second rows per level, said levels being mutually offset from each other in a direction of the fast axes, so that the first and second combined beams are composed of the emitter beams of the light emitters of the first and second row, respectively, which are stacked in the direction of the fast axes, and wherein the emitter beams of the light emitters disposed in a same level overlap in the polarization combined beam.

An aspect of the present invention provides a beam combining light source, comprising: a first row of light emitters for emitting a plurality of first emitter beams along a plurality of optical paths, each of the first emitter beams having a fast axis and a slow axis; a first row of beam collimating reflectors for collimating each of the first emitter beams in a plane of the slow axis thereof, and for re-directing the first emitter beams to mutually align the fast axes thereof for forming a first combined beam, wherein the first row of beam collimating reflectors is disposed at a distance from the first row of light emitters defining a space therebetween; a second row of light emitters for emitting a plurality of second emitter beams along a plurality of optical paths, each of the second emitter beams having a fast axis and a slow axis; a second row of beam collimating reflectors spaced apart from the second row of light emitters for collimating each of the second emitter beams in a slow axis plane, and for re-directing the second emitter beams to mutually align the fast axes thereof for forming a second combined beam, wherein the fast axes of the first and second emitter beams in the first and second combined beams are parallel to each other. A polarization converter is disposed in an optical path of one of the first and second combined beams for converting a polarization state thereof into a polarization state orthogonal to a polarization state of the other of the first and second combined beams. A polarization beam combiner is disposed for combining the first and second combined beams of light into a polarization combined beam of light. The light emitters of the first and second rows are disposed in a staggered arrangement with a lateral offset therebetween. The second row of collimating reflectors is disposed at least partially in the space between the first row of light emitters and the first row of collimating reflectors, and the lateral offset between the first and second rows of the light emitters is such that the collimating reflectors of the second row do not block any of the first emitter beams.

An aspect of the present invention provides a method for fabricating a beam combining light source, comprising the steps of: a) providing a support base having a stepped surface comprising a series of parallel mounting surfaces disposed in a plurality of vertically offset levels; b) mounting a first set of light emitters upon the stepped surface of the support base, one light emitter of the first set per mounting surface, so as to form a first row of light emitters for emitting first emitter beams along parallel optical paths; c) mounting a second set of light emitters upon the stepped surface of the support base, one light emitter of the second set per mounting surface, so as to form a second row of light emitters for emitting second emitter beams along parallel optical paths, and so that light emitters of the first and second rows are disposed in a staggered arrangement with a lateral offset therebetween; d) mounting a plurality of beam collimating reflectors, one beam collimating reflector per light emitter of the first and second rows of light emitters, so as to form first and second rows of beam collimating reflectors that are optically coupled to, and spaced apart from, the first and second rows of light emitters, respectively, for collimating the first and second emitter beams and for re-directing thereof for forming first and second combined beams composed of vertically stacked first and second emitter beams, respectively, and so that the second row of beam collimating reflectors is disposed at least partially in a space between the first row of light emitters and the first row of beam collimating reflectors coupled thereto. The lateral offset between the light emitters mounted upon a same mounting surface is such that the beam collimating reflectors of the second row do not block any of the first emitter beams.

BRIEF DESCRIPTION OF THE DRAWINGS

The invention will be described in greater detail with reference to the accompanying drawings which represent preferred embodiments thereof, in which like elements are indicated with like reference numerals, and wherein.

DETAILED DESCRIPTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art. The terms "horizontal" and "vertical" are used exclusively with respect to the plane of the sheet. The terms "connect," "couple," "mount" and similar terms with their inflectional morphemes do not necessarily denote direct and immediate connections, but also include connections through mediate elements or devices.

Figure 3A:
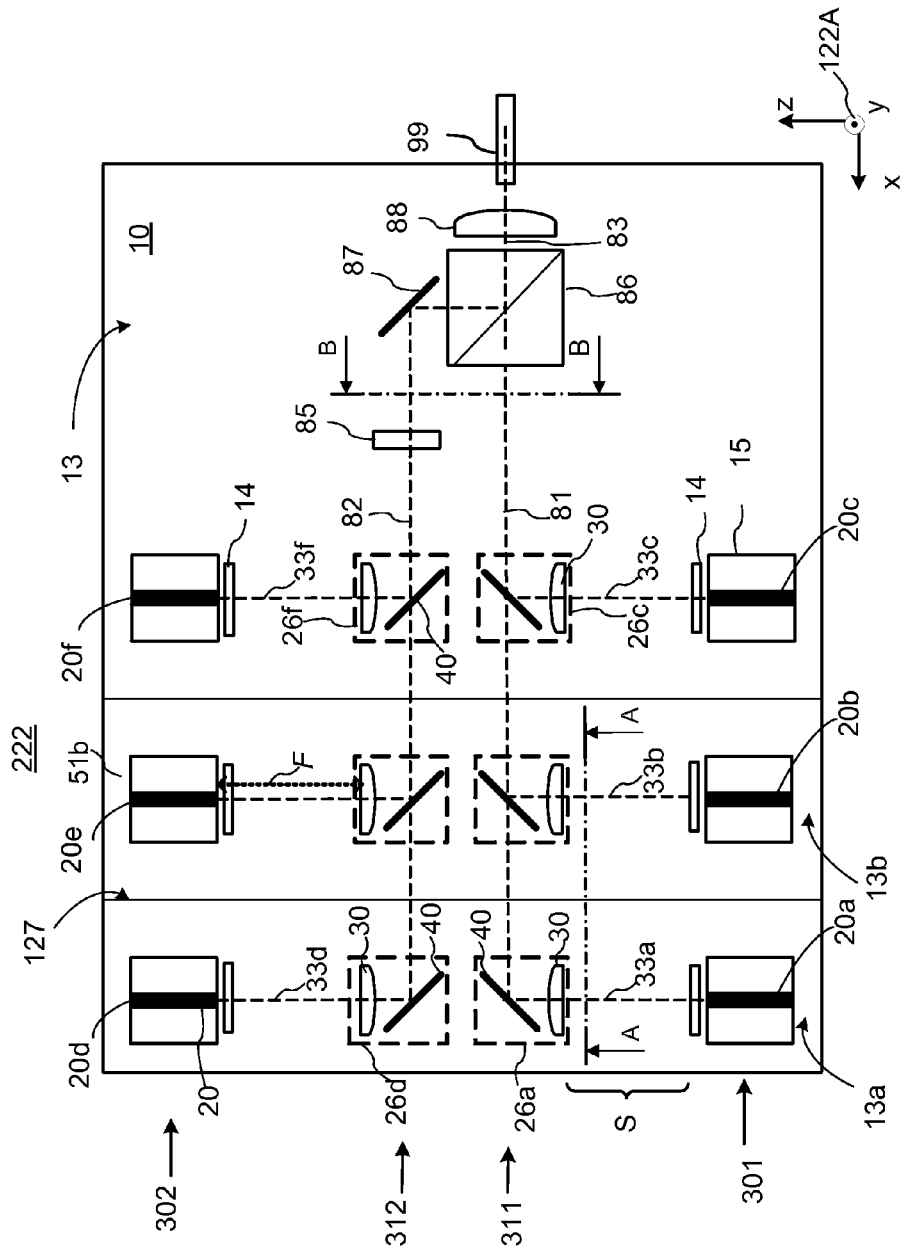
FIG. 3A is a schematic plane view of an exemplary beam combing optical source according to a first embodiment of the invention.
Figure 3B:
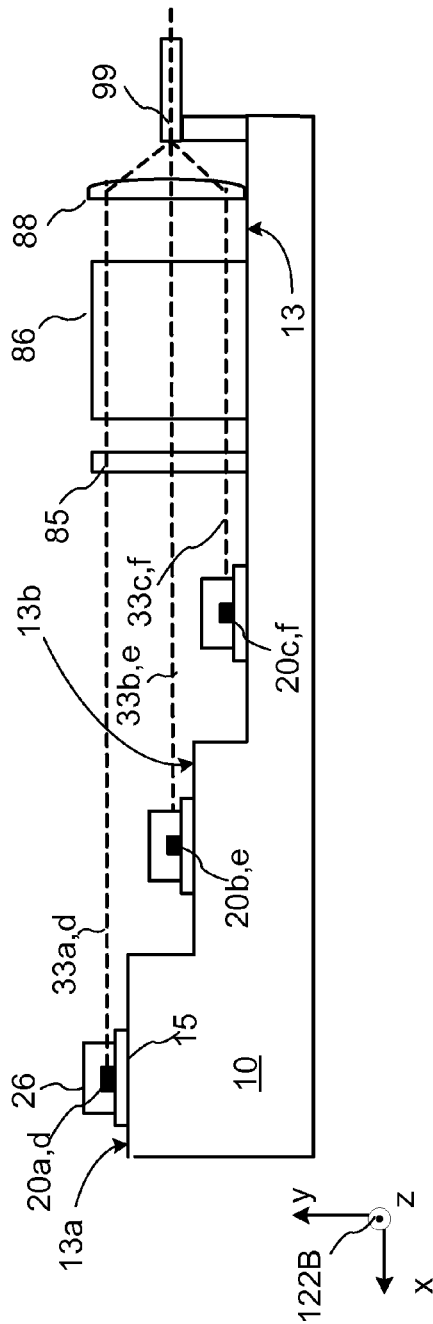
FIG. 3B is a schematic front view of the exemplary beam combing optical source of FIG. 3A.

With reference to FIGS. 3A and 3B, there is shown, in plane and side views, respectively, one exemplary layout of an apparatus 222 for coupling radiation beams into an output port 99 such as an optical fiber or waveguide. The apparatus 222 will also be referred to herein as a beam combining optical source 222. The apparatus 222 is comprised of a plurality, in the shown exemplary embodiment—six, individual light emitters 20a to 20f, which are hereinafter generally referred to as emitters 20. The emitters 20 are arranged in two rows 301 and 302, with emitters 20a, 20b and 20c forming the first emitter row 301, and emitters 20d, 20e and 20f forming the second emitter row 302. The emitters 20 are mounted on a stepped surface 13 of a support 10 in several, in this embodiment—three, vertically offset levels, with one emitter 20 from each emitter row 301, 302 per step 13a,b, or per level. For example, emitters 20a and 20d are mounted on a same top step 13a and are vertically offset from the rest of the emitters 20, emitters 20b and 20e are mounted on a same second top step 13b. In the shown embodiment, longitudinal axes of opposing emitters of the first and second emitter rows are aligned. The steps 13a and 13b have straight edges 127 in the XZ plane 122A. Within each emitter row 301 and 302, the emitters 20 are spread along the X axis of the XZ plane 122A so as to enable efficient heat sinking into the support base 10 and efficient heat dissipation.

The emitters 20a-20f emit light beams 33a-33f, respectively, which will be generally referred to as emitter beams 33. In one preferred configuration, emitter beams 33 emitted by emitters 20 of each of the emitter rows 301, 302 are generally parallel to each other. It may also be generally preferred for ease of manufacturing that all the emitters 20 are oriented in parallel and emit parallel emitter beams 33.

Figure 3C:
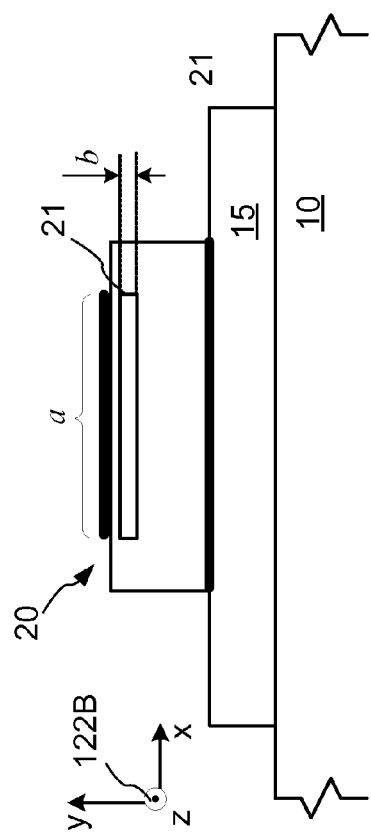
FIG. 3C is a front view of a single semiconductor light emitter with a broad emitting area.

In one embodiment the light emitters 20 are planar devices, such as laser diodes or light emitting diodes that are each disposed with the plane of p/n junctions parallel to the XZ plane 122A of FIG. 3A. In the shown exemplary embodiment they are mounted upon the stepped surface 13 with mounting pads 15, which provide electrical contact to the emitters 20 and thermal contact between emitters 20 and the support base 10. A front-facet view of one such emitter 20 is illustrated in FIG. 3C. The emitter 20 shown in FIG. 3C can be any of the emitters 20a-f of FIGS. 3A and 3B, as well as any of the emitters 20 of other embodiments described hereinbelow. The emitters 20 may have a broad active area, with the emitting region 21 at a front facet of the emitter having the shape of a broad stripe, with a height b of for example about 1 μm in the vertical, i.e. Y axis direction that is normal to the XZ plane 122A of FIG. 3A and to the surface 13, and with the width a along X axis of the XZ plane 122A ranging for example from about 25 μm to about 200 μm or broader. Due to the long and narrow shape of the light emitting area 21 in such embodiments, properties of the beam 33 differ for the X and Y directions. In the vertical (Y) direction, which is referred to as the fast axis direction, the small height of the active region of the emitter results in a high beam divergence, for example about 25° FWHM or greater. The radiation of beam 33 in the fast axis direction, which corresponds to the Y axis direction of the YZ plane 122B in FIGS. 3B and 3C, may be approximately diffraction-limited with an $M^2$ factor only slightly above 1. In the large width direction (X), also referred to as the slow axis direction, the light may be distributed over many spatial modes, resulting in a beam divergence that is larger than for a diffraction-limited beam with that size, although still significantly smaller than for the fast axis direction, for example 5-15° FWHM divergence angle. In the slow axis direction the beam quality in terms of focusability is reduced, with $M^2$ factor that may be of the order of 20 for a 100-μm stripe width a.

Referring again to FIGS. 3A and 3B, the apparatus 222 further includes fast axis collimators (FAC) 14, one per emitter 20, for collimating the emitter beams 33 in planes of their respective fast axes, which at the location of the FACs 14 are parallel to a YZ plane and orthogonal to plane XZ 122A of FIG. 3A. In this specification, the term "slow axis plane" refers to a plane defined by the slow axis of a beam and the beam's propagation direction, and the term "fast axis plane" refers to a plane defined by the fast axis of a beam and the beam's propagation direction. Each of the FACs 14 is disposed at the output of a corresponding emitter 20 in a close proximity to the emission aperture thereof, and can be an optical lens that is cylindrical, or, more generally, toroidal in shape, such that while the divergence of beam 33 in a YZ plane, which is normal to the XZ plane 122A of FIG. 3A, is minimized or at least substantially reduced so that the beams 33 are collimated in their respective fast axis YZ planes after the FACs 14, the divergence of beams 33 in XZ plane 122A is nearly unaffected or affected to a lesser degree.

The apparatus 222 further includes two rows 311 and 312 of beam collimating reflectors (BCR) 26a-26f, one beam collimating reflector per emitter 20, which are generally referred to hereinbelow as collimating reflectors 26 or BCR 26. Each of the BCR 26 is coupled to, and optically aligned with, a different emitter 20, and in the shown embodiments is formed by a slow axis collimator (SAC) 30 optically followed by a turning reflector 40 that may be embodied as a flat mirror or other beam-deflecting device, such as but not limited to an optical prism or a diffraction grating. Each of the light beams 33 is collimated by a respective SAC 30 in the XZ plane 122A, and is then reflected in a general direction of a polarization beam combiner (PBC) 86. The SACs 26 can each be in the form of a cylindrical or toroidal lens as known in the art. The function of SACs 26 is to collimate the beams 33 in XZ plane 122A, such that the light beams 33 are collimated in both XZ plane 122A, i.e. the slow axis plane, and a YZ plane, i.e. the fast axis plane. The rows 311 and 312 of BCRs 26 are referred to herein as the first and the second BCR rows, respectively.

In each of the first and second BCR rows 311 and 312, the turning mirrors 40 are disposed to reflect the respective beams 33 in a generally same direction so as to mutually align the fast axes thereof in a YZ plane, thereby forming two combined beams of light 81 and 82. Each of the combined beams 81 and 82 is composed of vertically stacked collimated emitter beams 33 of the corresponding emitter row 301 or 302, with mutually aligned fast axes. Note that the term "vertical" is used herein to refer to a direction along the Y coordinate that is normal to the plane of the main p/n junctions of the emitters 20 and to the XZ plane 122A of the FIG. 3.

Figure 4A:
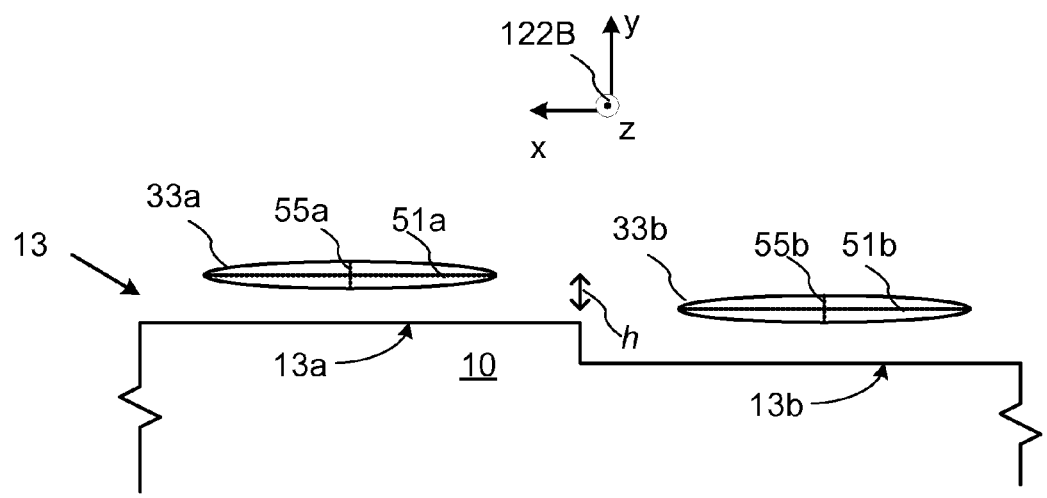
FIG. 4A is a schematic cross-sectional view of a portion of the optical source of FIG. 3A taken along the line A-A in FIG. 3A illustrating cross-sections two emitter beams.

FIG. 4A illustrates a cross-section by XY plane 122B of a portion of the apparatus 222, showing two emitter beams 33a and 33b radiated from adjacent emitters 20a and 20b of the first emitter row 301. The cross-section is taken along the line A-A in FIG. 3A, just upstream from the respective SACs 30. Dotted lines '55a' and '55b' indicate the fast axes of the respective emitter beams 33a and 33b, while dotted lines '51a' and '51b' indicate the slow axes of the respective emitter beams 33a and 33b. In each of the emitter rows 301 and 302, the slow-axis planes of the emitters 33 within the respective emitter row are parallel to each other and are separated in the fast axes direction "Y" by the step height h of the stepped surface 13. Accordingly, the beams 33a and 33b, prior to impinging upon the respective BCRs, are mutually offset both in the vertical "Y" direction, to which the fast axes 55 are parallel, and in the horizontal direction "X" along the emitter rows 301, 302, to which the slow axes 51 are parallel. The beam width along the slow axes 51 is much greater than the beam height along the fast axes 55. In the vertical direction the beams are offset by the step height h of the stepped surface 13 as indicated in FIG. 3B, which may be approximately equal to the beam height in the vertical direction after the FAC 14, or at the entrance of the PBC 86.

Figure 4B:
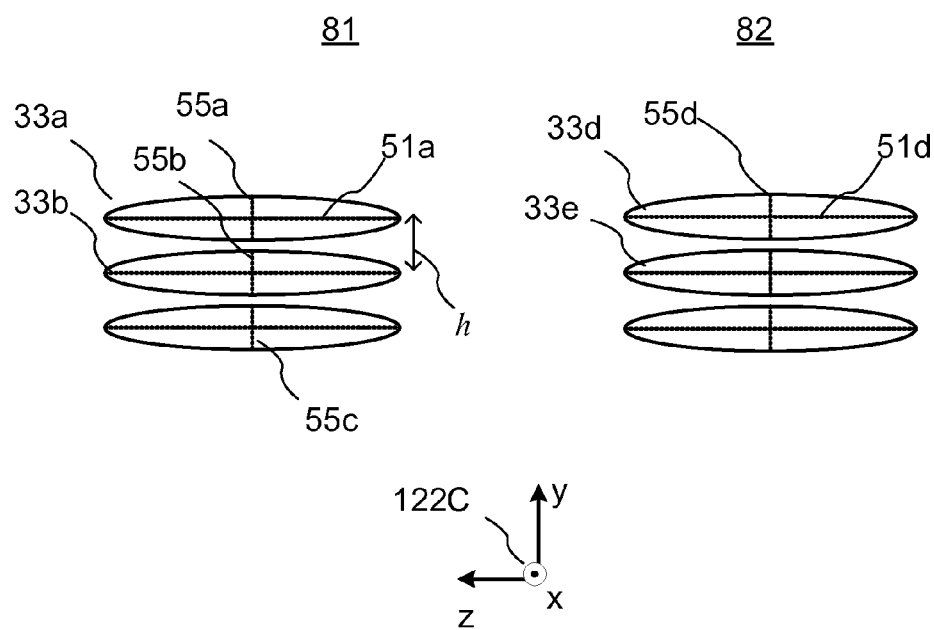
FIG. 4B is a schematic cross-sectional view taken along the line B-B illustrating cross-sections of the combined beams prior to polarization combining hereof.

FIG. 4B illustrate a cross-section of the combined beams 81 and 82 by an YZ plane 122C taken along the line B-B in FIG. 3A. The combined beams 81 and 82 are composed of the emitter beams 33 from the first and second emitter rows 301 and 302, respectively. In each of the combined beams 81 and 82, the constituent emitter beams 33 from emitters 20 of the respective emitter row are stacked vertically with their fast axes 55 aligned along a same line, resulting in a more square-like cross-section of the corresponding combined beam 81 or 82. Furthermore, each of the emitter beams 33*a-c* in the combined beam 81 is aligned in its slow axis 51 with a corresponding emitter beam 33*d-f* in the combined beam 82, so that their slow-axis planes are coincident. In other words, emitter beams 33 emitted by opposing light emitters 20 in the apparatus 222 are pair-wise co-planar in their respective slow-axis planes.

Each of the emitter beams 33 from the emitters 20 is polarized, having essentially same polarization state in the combined beams 81 and 82 in the B-B cross-section. A polarization converter 85 is provided in the optical path of one of the combined beams 81 and 82, for example in the optical path of the second combined beam 82 as shown in FIG. 3A, to convert its polarization state into an orthogonal polarization state. A beam redirector 87, embodied for example as a folding mirror, is further provided to re-direct one of the combined beams 81, 82 to intersect the other combined beam at a selected location, wherein the PBC 86 is disposed. In the illustrated embodiment, the optical radiation in the combined beams 81 and 82 is linearly polarized, the polarization converter 85 may be embodied as a half-wave plate, the PBC 86 is a polarization beam combining cube having perpendicular beam receiving faces, and the folding mirror 87 is disposed in the optical path of the second combined beam 82 and is oriented to direct it to intersect the first combined beam 81 perpendicular thereto, i.e. at a 90° angle. The polarization converter 85, the folding mirror 87 and the PBC 86 together perform a polarization multiplexing of co-planar emitter beams 33 of the combined beams 81 and 82, outputting a polarization combined beam 83, which then can be coupled into the fiber 99 using a coupling optics 88, such as a suitable coupling lens, for example convex-convex or convex-plane, or an anamorphic telescope as known in the art.

Figure 1:
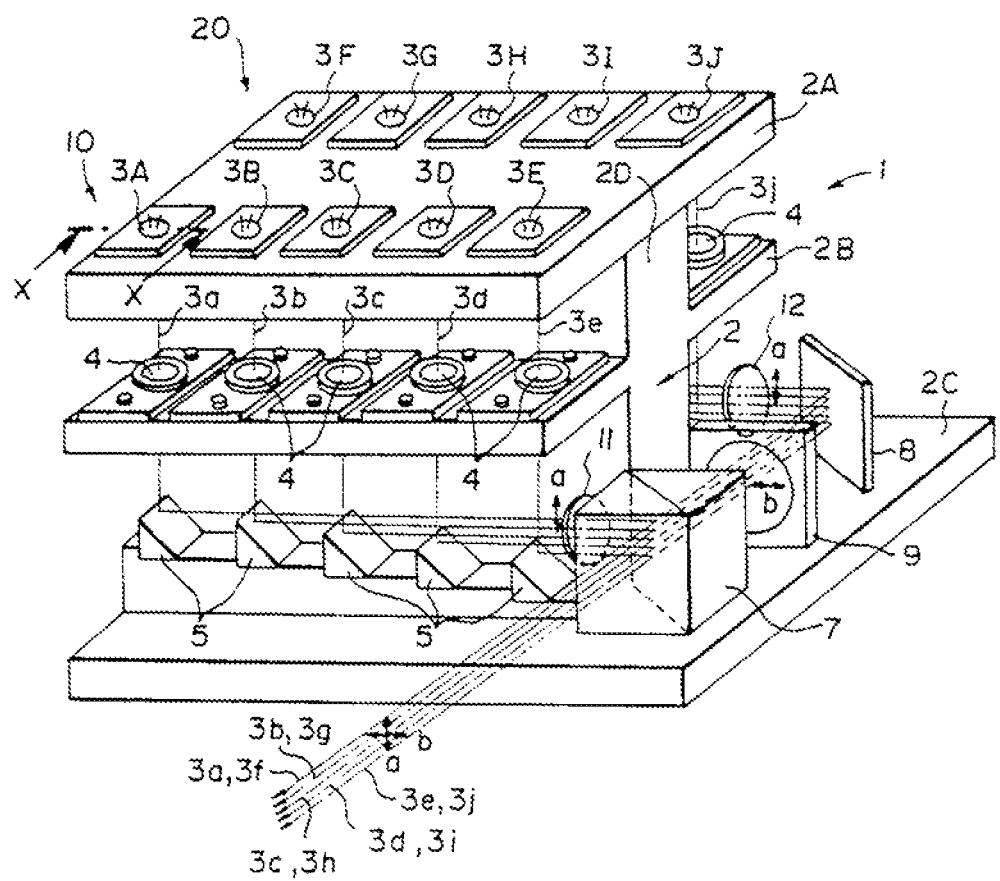
FIG. 1 is a block diagram of a prior art beam combing optical source having a substantially three-dimensional layout.
Figure 2:
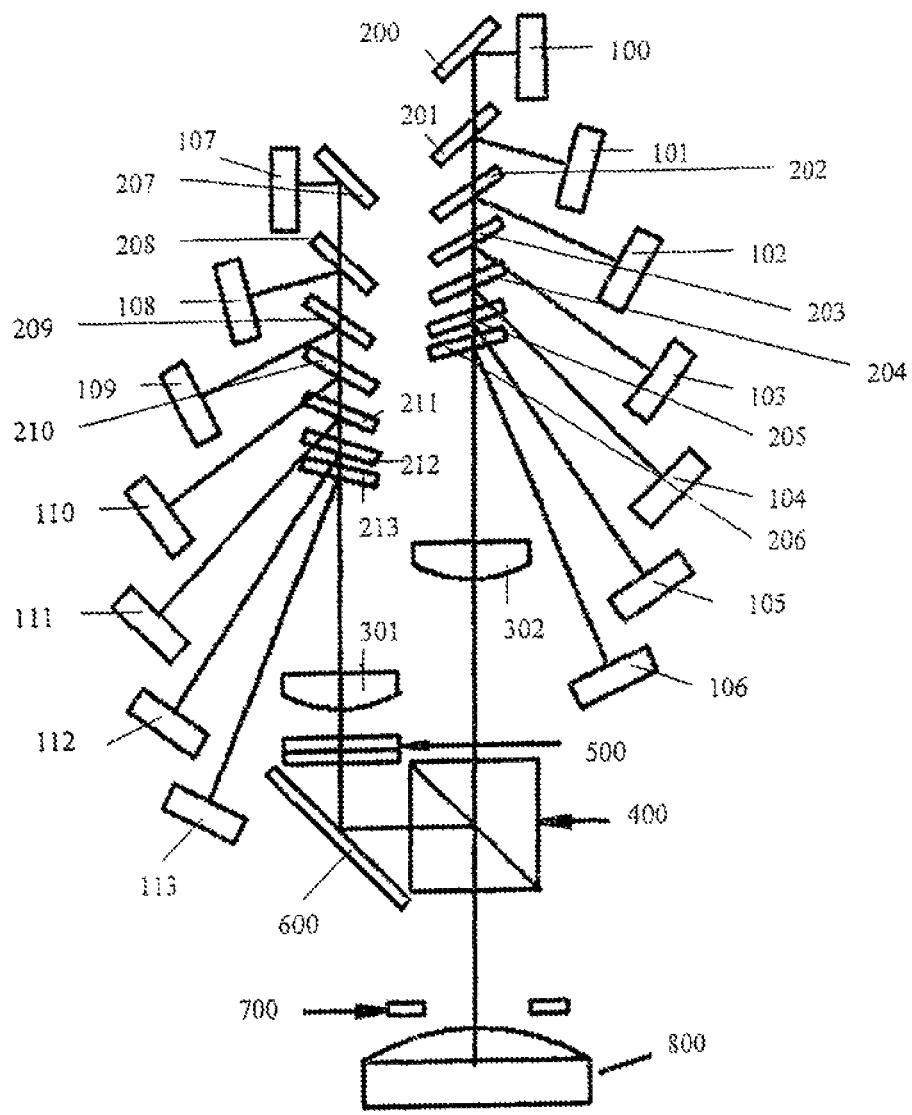
FIG. 2 is a block diagram of a prior art beam combing optical source having a substantially planar layout.

The apparatus 222 of FIGS. 3A and 3B has certain advantages with respect to those shown in FIGS. 1 and 2, such as enabling more simple assembly and optical alignment due to a generally planar arrangement wherein light emitters 33 in each of the rows, and optical elements 14, 26 associated therewith, are identically oriented. However, the apparatus 222 still has a relatively large footprint, which is related at least in part to a relatively large focal length of the SACs 30, as required to collimate the laser beams 33 in the slow axis plane. By way of example, the light emitters 33 are wide-area laser diodes having a 100 μm wide emitting aperture, and the emitter beams 33 have an NA (numerical aperture) in the slow axis plane of approximately 0.15, requiring that there is a distance F of about 10 mm between each of the emitters 20 and the corresponding SAC 30. The resulting spatial separation of the emitters 20 and the corresponding collimating reflectors 26 creates an un-used space in the apparatus 222, such as the space 'S' between the first emitter row 301 and the first BCR row 311, or more particularly between the FACs 14 and the corresponding SACs 30, as indicated in FIG. 3A.

Figure 5A:
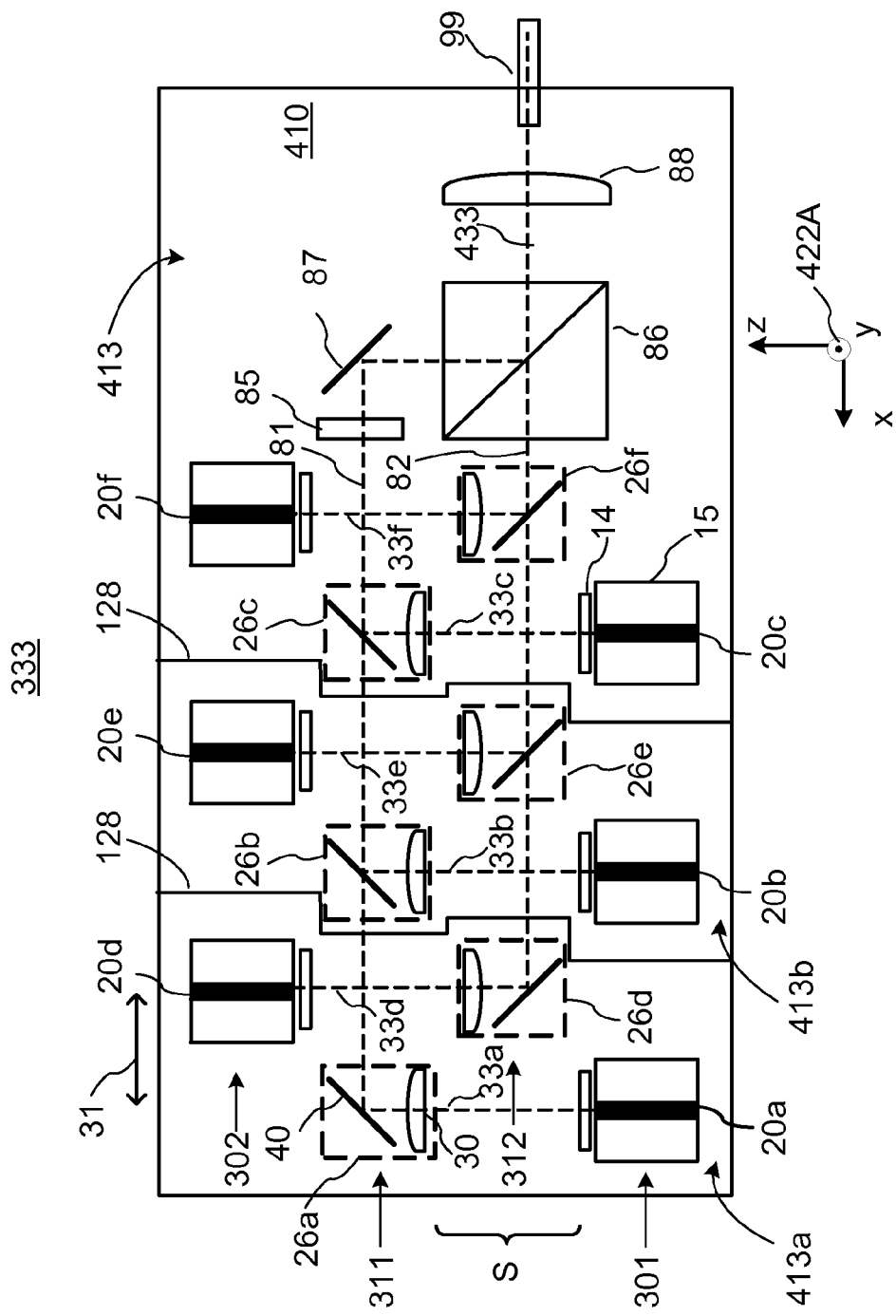
FIG. 5A is a schematic plane view of an exemplary beam combing optical source according to a second embodiment of the invention.
Figure 5B:
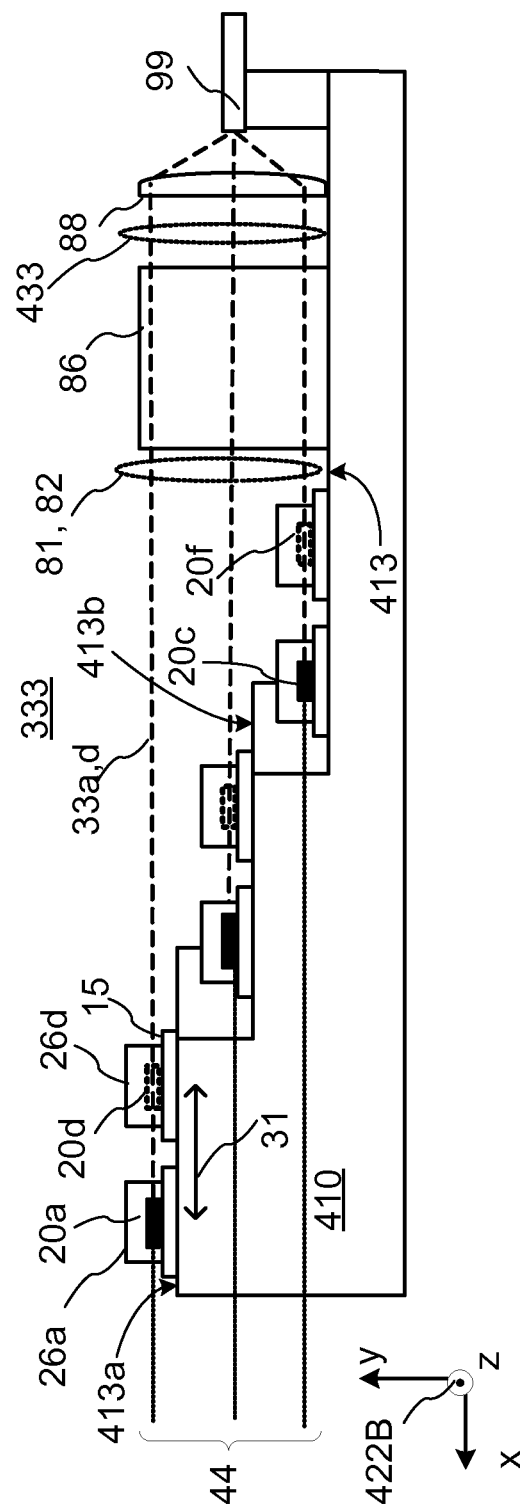
FIG. 5B is a schematic front view of the exemplary beam combing optical source of FIG. 5A.

Turning now to FIGS. 5A and 5B, there is shown a schematic layout of a more compact apparatus 333 for combining light from a plurality of individual emitters according to an exemplary embodiment of the present invention. The apparatus 333 will also be referred to herein as a beam combining optical source 333. FIG. 5A is a plan view, and a front view is shown in FIG. 5B. The apparatus 333 operates generally identically to the apparatus 222 as described hereinabove with reference to FIGS. 3A-4B, and for illustrative purposes contains the same optical elements that the apparatus 222 of FIGS. 3A and 3B, with like elements indicated using like reference labels.

Same as the apparatus 222, the apparatus 333 includes the first emitter row 301 composed of emitters 20*a*, 20*b*, 20*c*, and the second emitter row 302 composed of emitters 20*d*, 20*e*, 20*f*, which are supported by a support base 410 and are mounted on a stepped surface 413 thereof. In operation, the emitters 20*a*, 20*b*, 20*c* of the first emitter row 301 emit beams 33*a*, 33*b*, and 33*c*, respectively hereinafter generally referred to as the first emitter beams, while the emitters 20*d*, 20*e*, 20*f* of the second emitter row 302 emit beams 33*d*, 33*e*, and 33*f*, respectively, hereinafter generally referred to as the second emitter beams. The first row 311 of BCRs 26, one per each light emitter 20 of the first emitter row 301, is provided for collimating each of the first emitter beams 33*a*, 33*b* and 33*c* in the plane of the slow axis thereof, and for re-directing the first emitter beams 33*a-c* to mutually align the fast axes thereof for forming the first combined beam 82. The second row 312 of BCRs 26 is provided for collimating each of the second emitter beams 33*d-f* in the planes of their respective slow axes, and for re-directing the second light beams 33*d-f* so as to mutually align the fast axes thereof for forming the second combined beam 82. In each of the first and second rows 311, 312, individual BCRs 26 are aligned with respective individual emitters 20 of either the first or the second emitter row 301, 302, and are separated therefrom by the distance F that is defined by the focal length of the SAC 30. In the shown embodiment, the first and second BCR rows 311 and 312 of BCRs 26 are disposed generally in parallel to the first and second emitter rows 301 and 302, respectively, defining respective spaces therebetween. The FACs 14 are provided at the front facets of each of the emitters 20 for collimating the emitter beams 33 in the planes of their respective fast axes, which are directed along the Y axis normally to the XZ plane 422A. In some embodiments, the FACs 14 may be provided with the emitters 20, for example attached thereto, and may be considered to be comprised therein. By way of example, the light emitters 33 are wide-area laser diodes having a 100 μm wide emitting aperture, and the distance F between each of the emitters 20 and the corresponding SAC 30 is about 10 mm.

In contrast to the apparatus 222 of FIGS. 3A and 3B, the apparatus 333 has a more compact, space-conserving layout wherein the second row 312 of collimating reflectors 26 is disposed at least partially in the space 'S' between the first emitter row 301 and the first BCR row 311 of collimating reflectors 26. To enable this space-conserving placement, the first and second emitter rows 301 and 302 are disposed with a lateral offset 31 therebetween, with the emitters 20 of the first and second emitter rows 301, 302 forming a staggered, or interleaved, emitter arrangement. In this staggered arrangement, the emitters 20*d-f* of the second emitter row 302 are located and aligned so that the second emitter beams 33*d-f* are directed to pass between BCRs 26*a-c* of the first BCR row 311, and the first emitter beams 33*a-c* are directed to path between BCRs 26*d-f* of the second BCR row 312. To enable this staggered emitter arrangement without substantially increasing the length of the support base 410 in the X direction along the emitter rows 301, 302, the stepped surface 413 may have somewhat different layout than the stepped surface 13 of the apparatus 222, with steps 413*a*, 413*b* having non-straight edges 128, although embodiments with straight step edges 128 are also possible.

In the shown exemplary embodiment, the lateral offset between same-level emitters 20 of the first and second emitter rows 302, 301 is approximately half of the distance between adjacent emitters 20 in each of the first and second rows. By way of example, the emitters 20*a-c* of the first emitter row 301 may be spread along the X axis with a 8 mm spacing between their longitudinal axes, with the offset 31 being about 4 mm. However in other embodiments the lateral offset 31 between same-level emitters of the first and second emitter rows 301, 302 may differ from half of the emitter spacing in the row, and is generally selected so that the collimating reflectors 26*d-f* of the second row 312 do not block any of the first light beams 33*a-f*. Here, the term "lateral" indicates the direction along a row, such as from one emitter 20 within an emitter row 301 or 302 to another, and the term "lateral offset" is used to mean the distance between longitudinal axes of two emitters 20 located in a same level, e.g. mounted on a same step of the stepped surface 413.

As better shown in FIG. 5B, the emitters 20 are disposed in a plurality of levels 44, one light emitter 20 of each of the first and second emitter rows 301, 302 per level. The levels 44 are mutually offset from each other in the vertical direction, i.e. the direction of the fast axes of the emitters 20, which is also the Y axis direction of the YX plane 422B. The first and second combined beams 81, 82 are composed of the emitter beams 33*a-c* and 33*d-f* of the light emitters of the first and second row 301 and 302, respectively, which are stacked in the direction of the fast axes as illustrated in FIG. 4B. The emitter beams 33 of the light emitters 20 that are disposed in a same one of the levels 44 spatially overlap in the polarization combined beam 433, and mutually intersect prior to reaching the PBC 86. For example, the emitter beams 33*d*, 33*e* and 33*f*, prior to reaching corresponding BCRs 26*d-f*, intersect with the same-level emitter beams 33*a*, 33*b*, and 33*c*, respectively, in the first combined beam 81.

This vertically-offset arrangement of the emitters 20 is provided by the stepped surface 413 of the support base 410, upon which the emitters 20 are mounted. The stepped surface 413 is comprised of a sequence of parallel mounting surfaces such as those forming steps 413*a* and 413*b* of the stepped surface 413, the steps 413*a,b* having non-zero height h that is sufficient to enable the emitter beams of a higher level to pass over the BCRs of the lower level. Each of the steps 413*a,b* has one light emitter 20 from each of the first 301 and second 302 emitter rows mounted thereon, so that the planes of the slow axes of the respective emitter beams, such as emitter beams 33*a* and 33*d*, are coincident and parallel to the plane XZ 422A of the mounting surface 413.

Figure 6A:
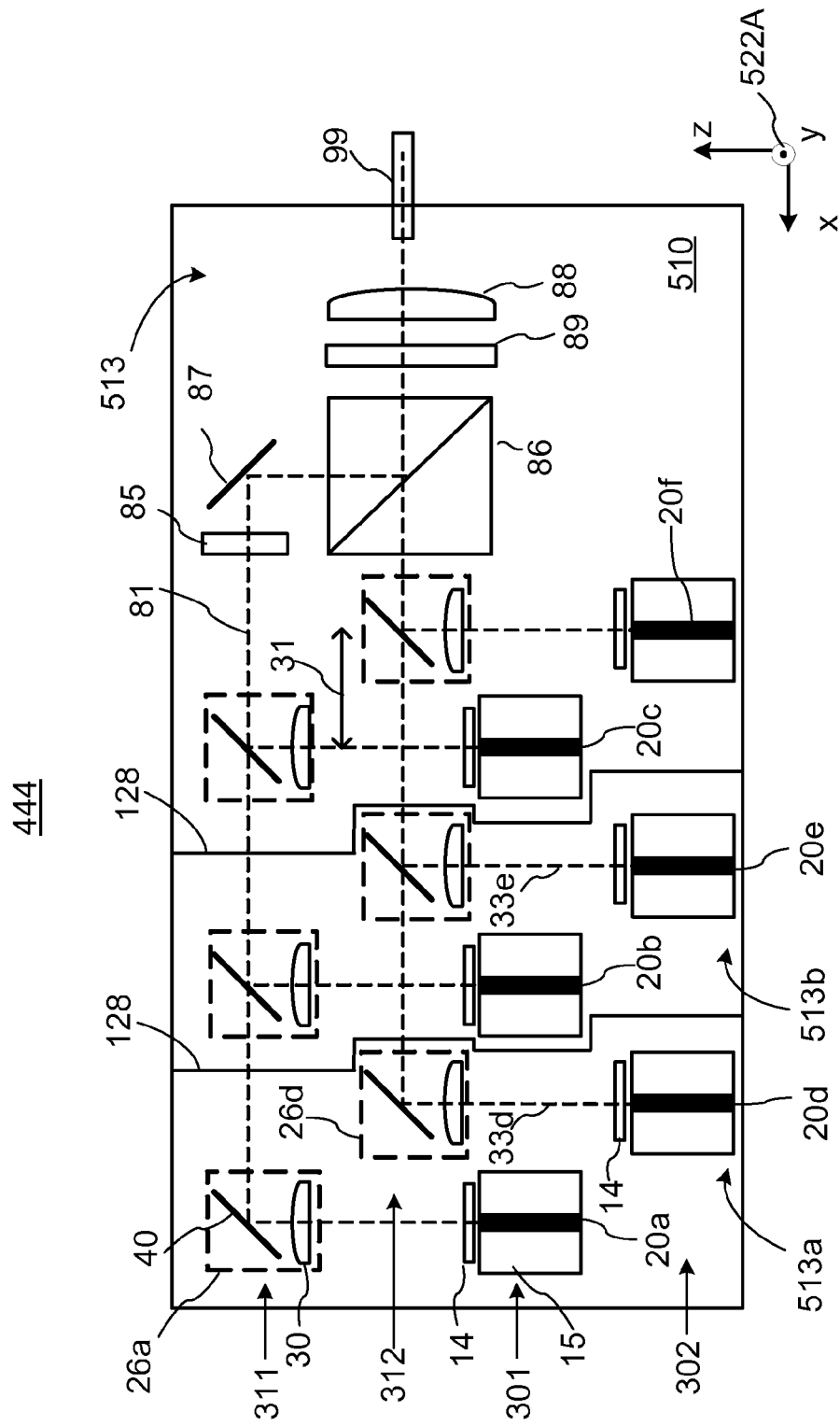
FIG. 6A is a schematic plane view of an exemplary beam combing optical source according to a third embodiment of the invention.
Figure 6B:
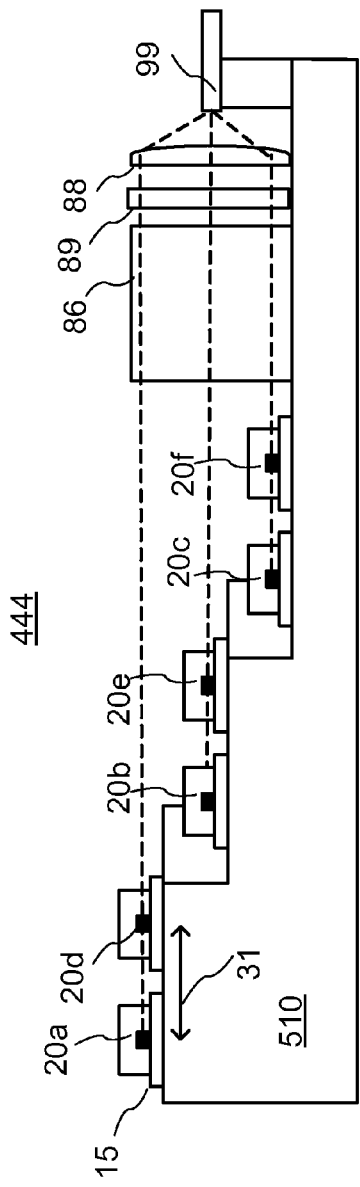
FIG. 6B is a schematic front view of the exemplary beam combing optical source of FIG. 6A.

Turning now to FIGS. 6A and 6B, there is illustrated, in plane and front views, respectively, an apparatus 444 for combining light from a plurality of individual emitters according to another exemplary embodiment of the present invention. The apparatus 444 will also be referred to herein as a beam combining optical source 444. The apparatus 444 operates generally identically to the apparatus 333 and for illustration purposes includes same optical components, which will not be therefore further described, and which are mounted on a stepped surface 513 of a support base 510.

The apparatus 444 provides another example of a compact beam combining layout with a reduced footprint, wherein the second BCR row 312 is disposed in the space between the first emitter row 301 and the first BCR row 311, and the first and second emitter rows 301, 302 have the lateral offset 31 therebetween, so as to form a staggered emitter arrangement. In the layout of FIG. 6A, however, the second emitter row 302 is disposed behind the first emitter row 301, so that the first emitter row 310 is sandwiched between the second emitter row 302 and the second BCR row 312 coupled thereto. Emitters 20*a-f* of both emitter rows are facing, and emit light, in a same general direction, e.g. in the Z-axis direction of XZ plane 522A. This device layout, wherein all the emitters 20 are disposed close to one side of the mounting stepped surface 513 of the support base 510 facing the same direction, may provide some alignment advantages and a simplified device assembly, with a possible trade-off in heat sinking due to a smaller separation between emitters 20 of the first and second emitter rows 301, 302 and a less uniform distribution of the heat load across the mounting surface 513.

Advantageously, the device layouts of the types illustrated in FIGS. 5A and 6A enable to reduce the width of their respective devices by a factor of about 2 compared to the device layout of FIG. 3A.

The aforedescribed embodiments of the invention are by way of example only, and many variations of the exemplary designs shown in FIGS. 3A to 6B are possible.

For example, each of the aforedescribed embodiments may include other optical components, such as additional beam processing and beam shaping elements. By way of example, the apparatus 444 is shown to include an optional Volume Bragg Grating (VBG) 89 disposed between the PBC 86 and the coupling lens 88 in the optical path of the polarization combined beam, for optionally providing an optical feedback to the emitters 20 for spectral locking thereof as known in the art.

Figure 7:
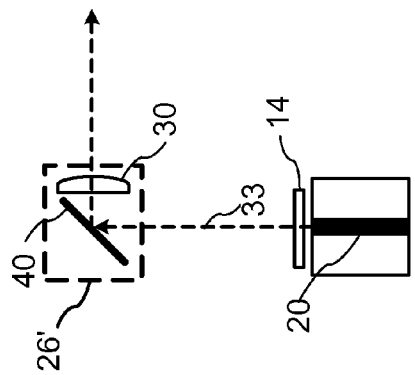
FIG. 7 is a block diagram illustrating an embodiment of a beam collimating reflector.

Although in FIGS. 3A, 5A and 6A the BCRs 26 are shown to be each composed of the SAC 30 optically followed by the flat reflector 40, other embodiments of the BCRs 26 are also possible. For example, FIG. 7 illustrate an embodiment wherein an emitter 20 is optically coupled to a BCR 26' wherein the SAC 30 is disposed optically after the flat mirror 40. In yet another embodiment, the BCR 26 may be a single element, such as a curved cylindrical collimating mirror, which combines the functionalities of the FAC 30 and the flat mirror 40.

Figure 8A:
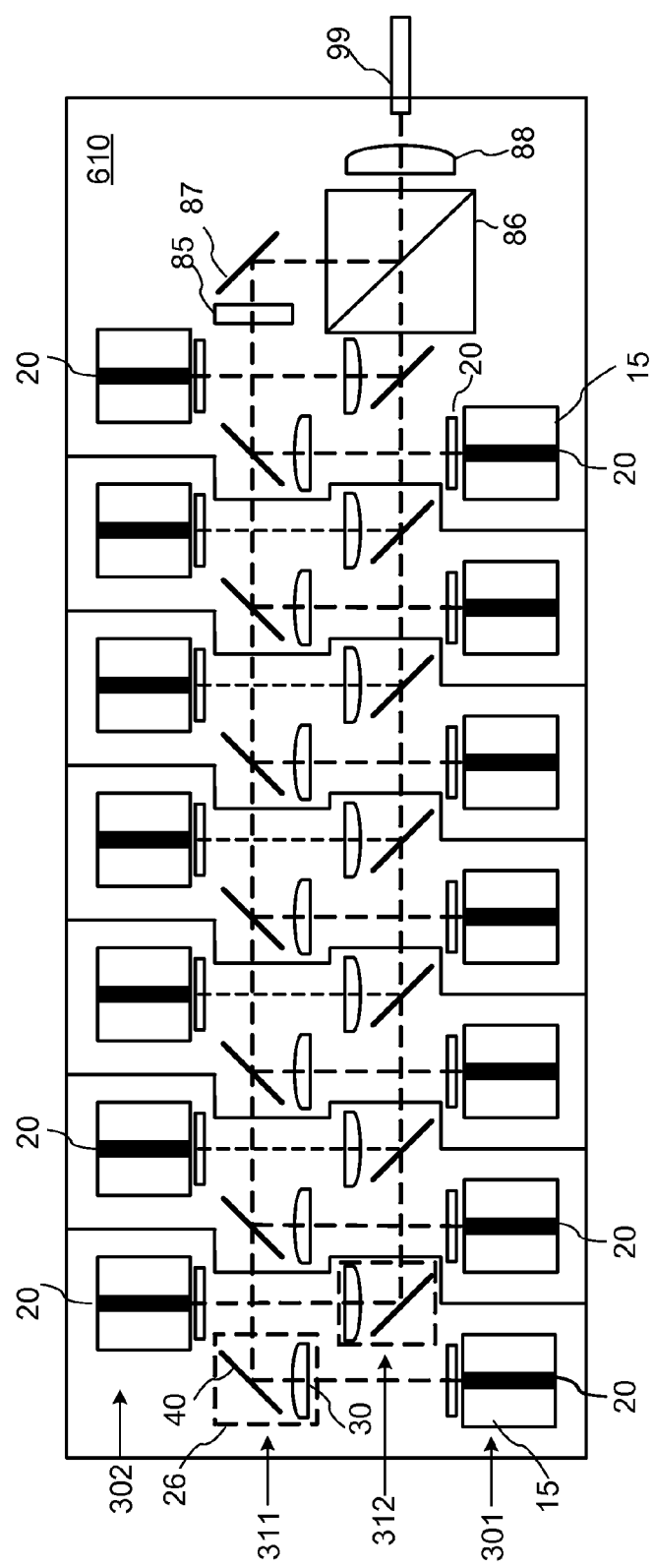
FIG. 8A is a schematic plane view of an embodiment of a beam combing optical source having 14 single emitters.
Figure 8B:
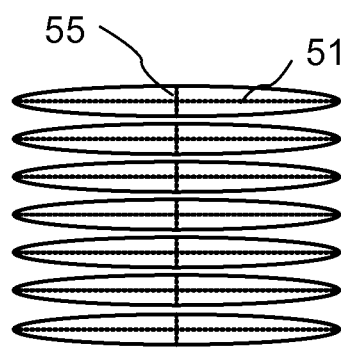
FIG. 8B is a schematic diagram illustrating a cross-section of a combined beam produced in the apparatus of FIG. 8A.

Although the illustrated embodiments included only 6 emitters, the beam combining configuration is scalable, and other embodiments may include a greater number of emitters. By way of example, FIG. 8A illustrates an embodiment wherein light from 14 emitters 20 is first combined into two combined beams, each of which comprised of 7 vertically staked emitter beams as illustrated in FIG. 8B so that the combined beam has an approximately square cross-section, and then polarization combined into a single output beam for coupling into the fiber 99.

Figure 9A:
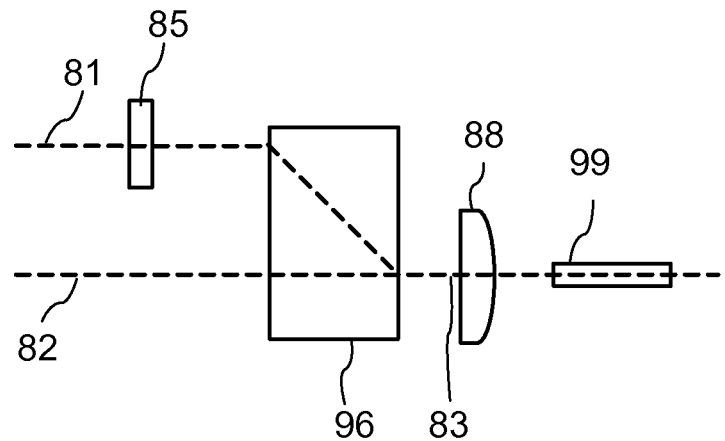
FIG. 9A is a block diagram illustrating one alternative polarization multiplexing arrangement that can be used in the embodiments of FIGS. 3A, 5A, 6A and 8A.
Figure 9B:
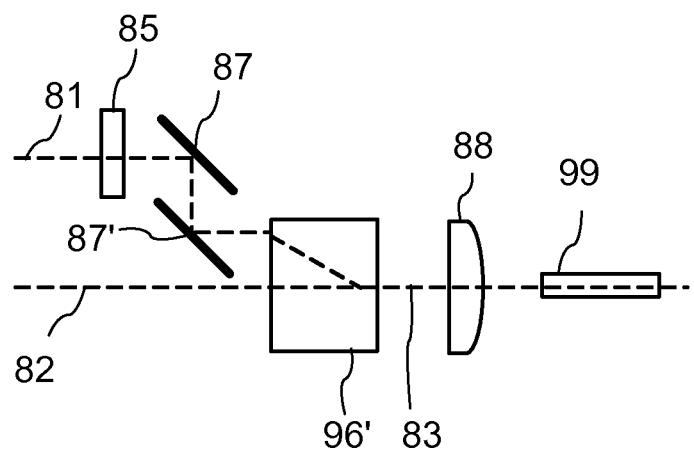
FIG. 9B is a block diagram illustrating another alternative polarization multiplexing arrangement that can be used in the embodiments of FIGS. 3A, 5A, 6A and 8A.

Furthermore, the half wave plate 85, or in more general case, the polarization converter 85 maybe disposed either before or after the folding mirror 87, or may also be disposed in the optical path of either the first or the second combined beam 81, 82. Moreover, polarization multiplexing of the emitter beams 33 can also be accomplished using alternative configurations as known in the art. Two of such alternative configurations for polarization multiplexing of the combined beams 81 and 82 are illustrated in FIGS. 9A and 9B. These configurations utilize walk-off crystals 96 and 96', respectively, to polarization combine the beams 81 and 82, after the polarization state of one of these beams has been converted to an orthogonal state. Here the first and second combined beams 81 and 82 impinge on the walk-off crystals 96 and 96' along parallel paths, and are polarization-combined by the respective walk-off crystals 96, 96' into the polarization combined beam 83 at the output of the crystal. In the embodiment of FIG. 9A, the folding mirror 87 is absent. In the embodiment of FIG. 9B, the folding mirror 87 is present, and an additional folding mirror 87' is added to bring the combined beams 81 and 82 closer together as they impinge upon the walk-off crystal 96', thereby enabling to reduce the size the walk-off crystal.

Furthermore, FIGS. 3A, 5A, 6A, 8A illustrate embodiments wherein the emitters 20 are all oriented with their optical axes perpendicular to the respective emitter rows 301, 302, i.e. perpendicular to the "X" direction, along which the emitters 20 are spread. Although this orientation is currently preferred as it simplifies the device assembly and minimizes the footprint, embodiments wherein emitters 20 emit light at different angles with respect to the emitter rows would also be within the scope of the present invention. Also, embodiments can be envisioned wherein the emitter rows 301 and 302 are curved rather than straight. Furthermore, embodiments can be envisioned wherein the emitters 20 of each of the first and second emitter rows can all be disposed in a same level without a vertical offset therebetween. In such embodiments, the respective emitter beams 33 emitted by emitters of each of the first and second emitter rows may, for example, be wavelength-multiplexed to form the combined beams 501 and 502 wherein the respective emitter beams overlap, for example using wavelength-selective elements in the BCRs 26 such as wavelength filters or wavelength-selective reflectors, and then polarization-multiplexed using the PBC 86 or alike.

Figure 10:
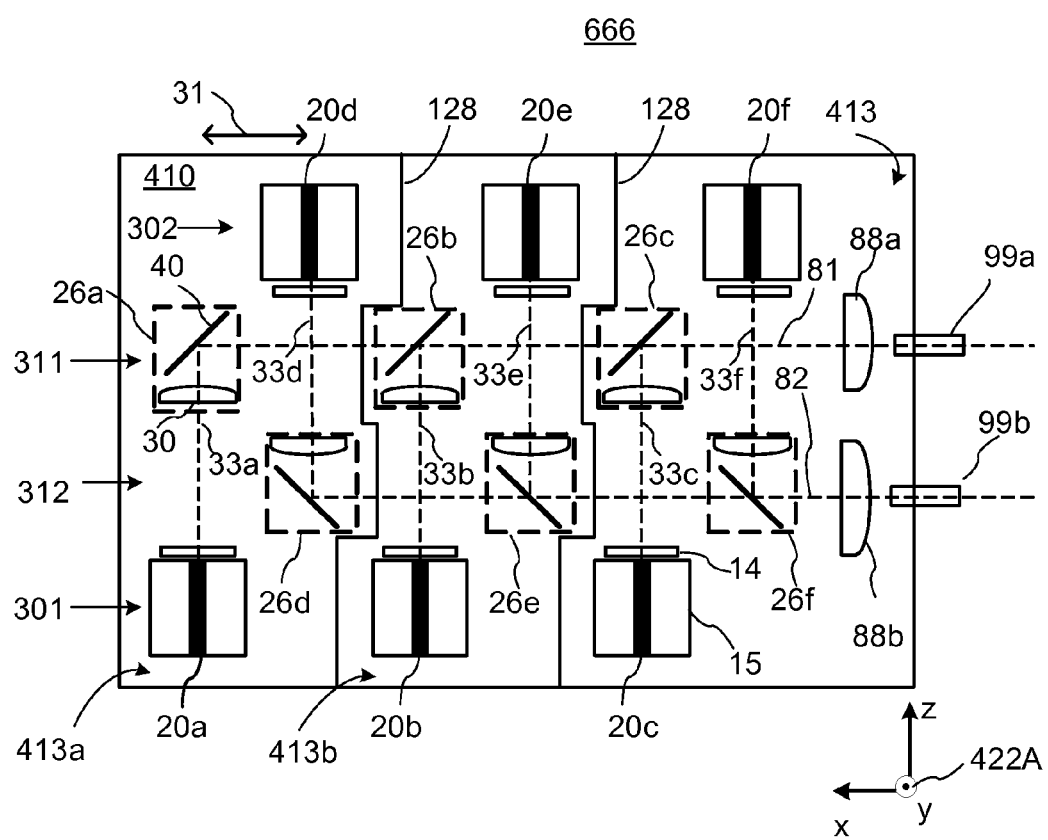
FIG. 10 is a schematic plane view of an exemplary beam combing optical source for outputting two beams of light formed of vertically stacked beams of two sets of light emitters.

In some embodiments of the invention, the beam combiner 86 and the beam redirector 87 can be omitted so as to result in a device that outputs two combined beams, each composed of vertically stacked beams of a plurality of planar light emitters. One such exemplary embodiment is illustrated in FIG. 10 showing a beam combining apparatus 666 having two optical ports 99a and 99b. The apparatus 666 operates generally as described hereinabove with reference to FIGS. 5a and 5b, so as to combine light beams from two sets of light emitters 301, 302 into two vertically-stacked combined beams 81, 82. However, the apparatus 666 lacks the polarization combining optical circuit of the apparatus 333 of FIG. 5A, formed by the elements 85, 87 and 86. Instead, the apparatus 666 includes first and second coupling optics 88a and 88b, which are disposed upon the base 410 in the optical paths of the two combined beams 81, 82, respectively, downstream from the respective BCR rows 311, 312, The coupling optics 88a,b are for coupling the combined beams 81, 82 into the two different optical fiber ports 99a, 99b. Advantageously, the apparatus 666 provides a compact dual-beam high-brightness light source that is characterized by a high optical-power-per-footprint ratio. It can be very useful in such applications as fiber laser pumping, where high-power high-brightness optical sources need to be fitted within a tightly size-controlled space.

An aspect of the present invention provides a method for fabricating an optical beam combining apparatus, which includes the following general steps:

a) providing a support base having a stepped surface comprising a series of parallel mounting surfaces disposed in a plurality of vertically offset levels;

b) mounting a first set of light emitters upon the stepped surface of the support base, one light emitter of the first set per mounting surface, so as to form a first row of light emitters for emitting first emitter beams along parallel optical paths;

c) mounting a second set of light emitters upon the stepped surface of the support base, one light emitter of the second set per mounting surface, so as to form a second row of light emitters for emitting second emitter beams along parallel optical paths, and so that light emitters of the first and second rows are disposed in a staggered arrangement with a lateral offset therebetween;

d) mounting a plurality of beam collimating reflectors, one beam collimating reflector per light emitter of the first and second rows of light emitters, so as to form first and second rows of beam collimating reflectors for collimating the first and second emitter beams, respectively, and for re-directing thereof for forming first and second combined beams, wherein the first and second rows of beam collimating reflectors are optically coupled to and spaced apart from the first and second rows of light emitters, respectively, and wherein the second row of beam collimating reflectors is disposed at least partially in a space between the first row of light emitters and the first row of beam collimating reflectors, and wherein the lateral offset between the first and second rows of the light emitters is such that the beam collimating reflectors of the second row do not block any of the first emitter beams.

It will be appreciated that the steps (b)-(d) are listed hereinabove not necessarily in the order in which they are performed during the device manufacturing, which may be varied as found convenient, and that one on the contrary the light emitters and the respective beam collimating reflectors can be mounted upon the base in any suitable order, and the steps of mounting maybe followed by optical alignment of the light emitters and the respective BCRs as known in the art. The step of mounting the light emitters may include first affixing the mounting pads 15 upon the mounting surfaces of the support base to provide thermal contact, and then affixing the light emitters 20 upon the mounting pads 15.

While the foregoing description and drawings represent exemplary embodiments of the present invention, it will be obvious to those skilled in the art that various changes may be made therein without departing from the scope of the present invention as defined by the appended claims.

We claim:

1. A beam combining light source, comprising:
a support base;
a first row of light emitters mounted upon the support base for emitting a plurality of first emitter beams along a plurality of optical paths, each of the first emitter beams having a fast axis and a slow axis;
a first row of beam collimating reflectors mounted upon the support base for collimating each of the first emitter beams in a plane of the slow axis thereof, and for re-directing the first emitter beams to mutually align the fast axes thereof for forming a first combined beam, wherein the first row of beam collimating reflectors is disposed at a distance from the first row of light emitters defining a space therebetween;
a second row of light emitters mounted upon the support base for emitting a plurality of second emitter beams along a plurality of optical paths, each of the second emitter beams having a fast axis and a slow axis;
a second row of beam collimating reflectors mounted upon the support base and spaced apart from the second row of light emitters for collimating each of the second emitter beams in a slow axis plane, and for re-directing the second emitter beams to mutually align the fast axes thereof for forming a second combined beam;
wherein light emitters of the first and second rows are disposed in a staggered arrangement with a lateral offset therebetween, and wherein:
the second row of collimating reflectors is disposed at least partially in the space between the first row of light emitters and the first row of collimating reflectors, and
the lateral offset between the first and second rows of the light emitters is such that the collimating reflectors of the second row do not block any of the first emitter beams.

2. The beam combining light source of claim 1, wherein the support base has a stepped surface comprised of a sequence of parallel mounting surfaces forming steps of the stepped surface, the steps having non-zero height, wherein each of the steps has at most two light emitters, one from each of the first and second rows of light emitters, mounted thereon with planes of the slow axes thereof parallel to the mounting surface, wherein each of the first and second combined beams of light is composed of the first or second emitter beams, respectively, which are stacked in a direction of the fast axes thereof.

3. The beam combining light source of claim 1, further comprising a plurality of fast axis collimators disposed at an output of the light emitters for collimating each of the first and second emitter beams in a fast axis plane.

4. The beam combining light source of claim 3, wherein the light emitters are spaced apart within each of the respective first and second rows, and are disposed to emit the first and second emitter beams generally perpendicular to the first and second rows of the light emitters.

5. The beam combining light source of claim 1, wherein each collimating reflector comprises a slow axis collimator and a turning mirror.

6. The beam combining light source of claim 1, further comprising first and second coupling optics disposed upon the support based in optical paths of the first and second combined beams, respectfully, for coupling thereof into two optical fibers.

7. The beam combining light source of claim 1, further comprising:
a polarization converter disposed in an optical path of one of the first and second combined beams for converting a polarization state thereof into a polarization state orthogonal to a polarization state of the other of the first and second combined beams; and,
a polarization beam combiner disposed for combining the first and second combined beams of light into a polarization combined beam of light.

8. The beam combining light source of claim 7, wherein the light emitters are disposed in a plurality of levels, one light emitter of each of the first and second rows per level, said levels being mutually offset from each other in a direction of the fast axes, so that the first and second combined beams are composed of the first and second emitter beams, respectively, which are stacked in the direction of the fast axes thereof, and wherein the emitter beams of the light emitters disposed in a same level overlap in the polarization combined beam.

9. The beam combining light source of claim 7, further comprising a coupling optics disposed downstream from the polarization beam combiner for focusing the polarization combined beam into an optical fiber.

10. The beam combining light source of claim 7, further comprising a beam re-director disposed in an optical path of one of the first and second combined beams for re-directing thereof towards the polarization beam combiner.

11. The beam combining light source of claim 1, wherein each light emitter comprises a broad area laser diode or a light emitting diode.

12. The beam combining light source of claim 1, wherein the light emitters of the first and second row are oriented facing a same general direction.

13. The beam combining light source of claim 1, wherein the emitters of the first and second rows are disposed for emitting the first and second emitter beams along parallel optical paths.

14. The beam combining light source of claim 2, wherein the first and second emitter beams of the light emitters mounted on a same step intersect.

15. A beam combining light source, comprising:
first and second rows of light emitters for emitting a plurality of first emitter beams and a plurality of second emitter beams, respectively;
first and second rows of beam collimating reflectors for collimating the first and second emitter beams, respectively, and for re-directing thereof for forming first and second combined beams, wherein the first and second rows of beam collimating reflectors are optically coupled to and spaced apart from the first and second rows of light emitters, respectively;
wherein the light emitters of the first and second rows are disposed in a staggered arrangement with a lateral offset therebetween, and wherein:
the second row of beam collimating reflectors is disposed at least partially in a space between the first row of light emitters and the first row of beam collimating reflectors, and
the lateral offset between the first and second rows of the light emitters is such that the beam collimating reflectors of the second row do not block any of the first emitter beams.

16. The beam combining light source of claim 15, wherein the emitter beams have each a fast axis and a slow axis, and wherein the beam collimating reflectors are for collimating the emitter beams in planes of the slow axes thereof, further comprising a plurality of fast axis collimators for collimating each of the first and second emitter beams in a plane of the fast axis thereof.

17. The beam combining light source of claim 16, further comprising a polarization beam combiner disposed for combining the first and second combined beams of light into a polarization combined beam of light.

18. A method for fabricating a beam combining light source, comprising:
a) providing a support base having a stepped surface formed of a series of parallel mounting surfaces disposed in a plurality of vertically offset levels;
b) mounting a first set of light emitters upon the stepped surface of the support base, one light emitter of the first set per mounting surface, so as to form a first row of light emitters for emitting first emitter beams along parallel optical paths;
c) mounting a second set of light emitters upon the stepped surface of the support base, one light emitter of the second set per mounting surface, so as to form a second row of light emitters for emitting second emitter beams along parallel optical paths, and so that light emitters of the first and second rows are disposed in a staggered arrangement with a lateral offset between light emitters of the first and second sets mounted upon a same mounting surface;
d) mounting a plurality of beam collimating reflectors, one beam collimating reflector per light emitter of the first and second rows of light emitters, so as to form first and second rows of beam collimating reflectors that are optically coupled to, and spaced apart from, the first and second rows of light emitters, respectively, for collimating the first and second emitter beams and for re-directing thereof for forming first and second combined beams, respectively, and so that the second row of beam collimating reflectors is disposed at least partially in a space between the first row of light emitters and the first row of beam collimating reflectors coupled thereto, and wherein the lateral offset between the light emitters mounted upon a same mounting surface is such that the beam collimating reflectors of the second row do not block any of the first emitter beams.

* * * * *